(12) United States Patent
Xu et al.

(10) Patent No.: US 11,563,043 B2
(45) Date of Patent: Jan. 24, 2023

(54) CHIP PACKAGING STRUCTURE AND CHIP PACKAGING METHOD

(71) Applicant: Forehope Electronic (Ningbo) Co., Ltd., Ningbo (CN)

(72) Inventors: Yupeng Xu, Ningbo (CN); Li Li, Ningbo (CN); Lei Zhong, Ningbo (CN)

(73) Assignee: Forehope Electronic (Ningbo) Co., Ltd., Ningbo (CN)

( * ) Notice: Subject to any disclaimer, the term of this patent is extended or adjusted under 35 U.S.C. 154(b) by 0 days.

(21) Appl. No.: 17/223,735

(22) Filed: Apr. 6, 2021

(65) Prior Publication Data
US 2021/0327934 A1 Oct. 21, 2021

(30) Foreign Application Priority Data
Apr. 15, 2020 (CN) .......................... 202010299125.4

(51) Int. Cl.
*H01L 23/00* (2006.01)
*H01L 27/146* (2006.01)

(52) U.S. Cl.
CPC .. *H01L 27/14618* (2013.01); *H01L 27/14683* (2013.01); *H01L 24/73* (2013.01);
(Continued)

(58) Field of Classification Search
CPC ... H01L 27/14683; H01L 24/73; H01L 24/92; H01L 2224/73204; H01L 2224/92125
See application file for complete search history.

(56) References Cited

U.S. PATENT DOCUMENTS

| 5,867,368 A | 2/1999 | Glenn |
| 2005/0104186 A1 | 5/2005 | Yang et al. |

(Continued)

FOREIGN PATENT DOCUMENTS

| CN | 103972256 A | | 8/2014 | |
| CN | 105810705 A | * | 7/2016 | ....... H01L 27/14601 |
| CN | 110648980 A | | 1/2020 | |

OTHER PUBLICATIONS

Notification to Grant Patent Right for Invention, CN Application No. 202010607458.9, dated Aug. 27, 2020, 3 pages.
(Continued)

*Primary Examiner* — Mohammad M Choudhry
(74) *Attorney, Agent, or Firm* — Casimir Jones, SC; Robert A. Goetz

(57) ABSTRACT

The present disclosure provides a chip packaging structure and a chip packaging method, relating to the technical field of chip packaging. In the above, the chip packaging structure includes: a substrate, wherein a light-transmitting hole penetrating through upper and lower surfaces thereof is provided on the substrate, and openings communicated with the light-transmitting hole are formed on two opposite sidewall surfaces of the substrate, respectively; light-transmitting glass, wherein two opposite sides of the light-transmitting glass are inserted into the two openings, respectively, and shield the light-transmitting hole; a chip, provided on the upper surface of the substrate, wherein a photosensitive area of the chip faces the light-transmitting glass; and a packaging layer, provided on the chip and the upper surface of the substrate so as to package the chip on the substrate.

5 Claims, 4 Drawing Sheets

(52) U.S. Cl.
CPC .... *H01L 24/92* (2013.01); *H01L 2224/73204* (2013.01); *H01L 2224/92125* (2013.01)

(56) References Cited

U.S. PATENT DOCUMENTS

2007/0090504 A1     4/2007   Chen et al.
2012/0210542 A1*   8/2012   Yang .................... F16B 21/165
                                                                                        24/369

OTHER PUBLICATIONS

First Office Action, CN Application No. 202010607458.9, dated Aug. 13, 2020, 16 pages.
Search Report, CN Application No. 2020106074589, dated Jun. 30, 2020, 3 pages.

* cited by examiner

CHIP PACKAGING STRUCTURE AND CHIP PACKAGING METHOD

CROSS-REFERENCE TO RELATED APPLICATION

The present disclosure claims the priority to the Chinese patent application with the filing number 202010299125.4 filed on Apr. 15, 2020 with the Chinese Patent Office, and entitled "Chip Packaging Structure and Chip Packaging Method", the contents of which are incorporated herein by reference in entirety.

TECHNICAL FIELD

The present disclosure relates to the technical field of chip packaging, in particular, to a chip packaging structure and a chip packaging method.

BACKGROUND ART

The image sensor can receive an optical signal, and convert the optical signal into an electrical signal carrying image information, therefore the image sensor is widely applied to various electronic products such as digital cameras, image sensing modules for vehicles, and monitoring cameras. The current packaging structure of the image sensor mainly includes the following two types:

(1) conventional image sensor packaging structure. This packaging manner is mainly as follows: placing an image sensing chip on a substrate, connecting the image sensing chip with the substrate by means of wire bonding (gold wire/copper wire/alloy wire), and then pasting a light-transmitting cover (for example, glass) above the image sensing chip by dispensing glue, thus achieving a light-transmitting purpose, and then protecting the stacked chip and substrate by plastic packaging, thereby completing the packaging of the image sensor.

(2) Conventional flip-chip image sensor packaging structure. This packaging manner is mainly as follows: placing a flip-chip image sensing chip on a back surface of a substrate (a light-transmitting hole is reserved at the bottom of the substrate), then mounting balls on the back surface of the substrate, and mounting light-transmitting glass on a front surface of the substrate, thereby completing the packaging of the flip-chip image sensor.

In the prior art, for the packaging structure and the packaging method of image sensor, the light-transmitting glass is fixedly provided on the surface of the substrate, especially for the conventional image sensor packaging structure described above, after the light-transmitting glass is fixed to a photosensitive area of the chip using glue, the stacked structure will be protected through the plastic packaging process, then the light-transmitting glass is fixed in a plastic package body, therefore, when the light-transmitting glass is damaged, the image sensor has to be integrally replaced, but the light-transmitting glass cannot be replaced independently, which undoubtedly will bring about an increase in the maintenance costs.

SUMMARY

An embodiment of the present disclosure provides a chip packaging structure, including:

a substrate, wherein a light-transmitting hole penetrating through upper and lower surfaces thereof is provided on the substrate, and openings communicated with the light-transmitting hole are formed on two opposite sidewall surfaces of the substrate, respectively;

light-transmitting glass, wherein two opposite sides of the light-transmitting glass are inserted into the two openings, respectively, and shield the light-transmitting hole;

a chip, provided on the upper surface of the substrate, wherein a photosensitive area of the chip faces the light-transmitting glass; and a packaging layer, provided on the chip and the upper surface of the substrate so as to package the chip on the substrate.

An embodiment of the present disclosure provides a chip packaging method, including:

providing a packaging substrate, wherein the packaging substrate includes a plurality of packaging areas, each packaging area is provided with a light-transmitting hole penetrating through upper and lower surfaces thereof, and each packaging area is embedded with light-transmitting glass shielding the light-transmitting hole;

packaging a chip on the upper surface of the packaging area, wherein the photosensitive area of the chip faces the light-transmitting glass to obtain a substrate structure; and performing a cutting operation on the substrate structure, so as to form openings communicated with the light-transmitting hole on two opposite cutting surfaces of the packaging area, respectively, so that two opposite sides of the light-transmitting glass are inserted into the two openings, respectively, thus obtaining the chip packaging structure.

BRIEF DESCRIPTION OF DRAWINGS

In order to more clearly illustrate technical solutions of embodiments of the present disclosure, accompanying drawings which need to be used in the embodiments of the present disclosure will be introduced briefly below, and it should be understood that the accompanying drawings below merely show some embodiments of the present disclosure, and therefore should not be considered as limitation on the scope, and a person ordinarily skilled in the art still could obtain other relevant accompanying drawings according to these accompanying drawings, without using any creative efforts.

Figure 1:
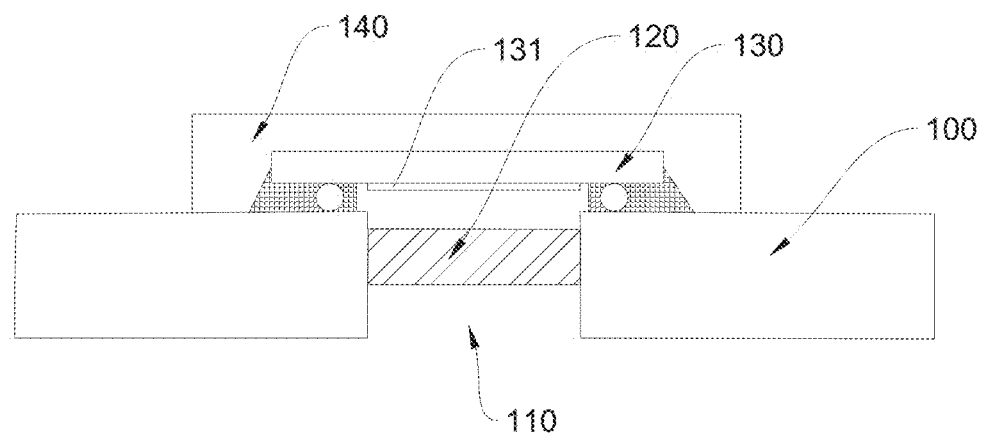
FIG. 1 is a side view of a chip packaging structure provided in an embodiment of the present disclosure.

Reference sign: 100—substrate; 110—light-transmitting hole; 120—light-transmitting glass; 130—chip; 131—photosensitive area; 140—packaging layer; 151—first clamping groove; 152—second clamping groove; 122—second side of light-transmitting glass; 124—fourth side of light-transmitting glass; 160—filling glue; 170—metal ball; 111—first light-transmitting hole; 310—first light-transmitting substrate; 112—second light-transmitting hole; 320—second light-transmitting substrate.

DETAILED DESCRIPTION OF EMBODIMENTS

In order to make objectives, technical solutions and advantages of the embodiments of the present disclosure clearer, the technical solutions in the embodiments of the present disclosure will be described clearly and completely below in conjunction with the accompanying drawings in the embodiments of the present disclosure, and apparently, some but not all embodiments of the present disclosure are described. Generally, components in the embodiments of the present disclosure described and shown in the accompanying drawings herein may be arranged and designed in different configurations.

Therefore, the detailed description below of the embodiments of the present disclosure provided in the accompanying drawings is not intended to limit the scope of protection of the present disclosure, but merely represents chosen embodiments of the present disclosure. Based on the embodiments of the present disclosure, all of other embodiments obtained by those ordinarily skilled in the art without any creative efforts shall fall within the scope of protection of the present disclosure.

It should be noted that similar reference signs and letters represent similar items in the following accompanying drawings, therefore, once a certain item is defined in one accompanying drawing, it is not needed to be further defined or explained in subsequent accompanying drawings.

In the description of the present disclosure, it should be noted that orientation or positional relationships indicated by terms such as "upper", "lower", "inner" and "outer", if appear, are based on orientation or positional relationships as shown in the figures, or orientation or positional relationships of a product of the present disclosure when being conventionally placed in use, merely for facilitating describing the present disclosure and simplifying the description, rather than indicating or suggesting that related devices or elements have to be in the specific orientation or configured and operated in a specific orientation, therefore, they should not be construed as limitation to the present disclosure.

Besides, terms such as "first" and "second", if appear, are merely for distinctive description, but should not be construed as indicating or implying importance in the relativity.

It should be indicated that the features in the embodiments of the present disclosure may be combined with each other if there is no conflict.

Objectives of embodiments of the present disclosure include, for example, providing a chip packaging structure and a chip packaging method, which can realize detachment of the light-transmitting glass, and facilitate maintenance.

In a first aspect, an embodiment of the present disclosure provides a chip packaging structure, including:

a substrate, wherein a light-transmitting hole penetrating through upper and lower surfaces thereof is provided on the substrate, and openings communicated with the light-transmitting hole are formed on two opposite sidewall surfaces of the substrate, respectively;

light-transmitting glass, wherein two opposite sides of the light-transmitting glass are inserted into the two openings, respectively, and shield the light-transmitting hole;

a chip, provided on the upper surface of the substrate, wherein a photosensitive area of the chip faces the light-transmitting glass; and a packaging layer, provided on the chip and the upper surface of the substrate so as to package the chip on the substrate.

In the above technical solution, by embedding the light-transmitting glass in the substrate, and exposing two sides of the light-transmitting glass through corresponding openings on two sidewall surfaces of the substrate, the light-transmitting glass may be pushed out from the sides of the substrate, and detachment of the light-transmitting glass from the sides is realized, so that the light-transmitting glass can be changed quite conveniently, and the maintenance costs of the chip are reduced; moreover, the light-transmitting glass is disposed inside the substrate, then the light-transmitting glass may be protected, the service time thereof is prolonged.

Optionally, a first clamping groove is formed on a first sidewall surface of the light-transmitting hole, the first clamping groove is in communication with the opening, the first clamping groove extends along a connecting line direction of the two openings, and one side of the light-transmitting glass is inserted into the first clamping groove.

Optionally, a second clamping groove parallel to and directly facing the first clamping groove is provided on the second sidewall surface of the light-transmitting hole, the second clamping groove is communicated with the opening, the second clamping groove extends along the connecting line direction of the two openings, and the other side of the light-transmitting glass is inserted into the second clamping groove.

Optionally, the first clamping groove and the second clamping groove are filled with sealing glue, so as to fix the light-transmitting glass; and the sealing glue is of a thermoplastic material.

In the above technical solution, by providing the first clamping groove and the second clamping groove for placing the light-transmitting glass inside the substrate, meanwhile, fixing the light-transmitting glass with the sealing glue, due to the thermoplasticity of the sealing glue, detachment of the light-transmitting glass from the side may be realized after the sealing glue at the bottom of the glass is heated, then on the one hand, the mounting of the light-transmitting glass is more solid, and on the other hand, the detachment and installation thereof are also more convenient.

Optionally, bumps of the chip are electrically connected to a circuit structure on the substrate, and filling glue is provided between the bumps and the substrate; and a substrate fence is provided on the upper surface of the substrate, wherein the substrate fence is provided around the light-transmitting hole, so as to block the filling glue from entering the photosensitive area of the chip.

By providing the substrate fence on the substrate, when glue is filled at the bottom of the chip, the filling glue is prevented from entering the photosensitive area of the chip by the height of the fence, so that light may be avoided from scattering and refracting from the bump area of the chip to cause the problem of blurring of product image, and the product yield is improved.

Optionally, the packaging structure further includes:

metal balls provided outside the packaging layer, wherein the metal balls are electrically connected to the circuit structure on the substrate, and the metal balls and the chip are provided on the same side of the substrate.

An embodiment of the present disclosure provides a chip packaging method, including:

providing a packaging substrate, wherein the packaging substrate includes a plurality of packaging areas, each packaging area is provided with a light-transmitting hole penetrating through upper and lower surfaces thereof, and each packaging area is embedded with light-transmitting glass shielding the light-transmitting hole;

packaging a chip on the upper surface of the packaging area, wherein the photosensitive area of the chip faces the light-transmitting glass to obtain a substrate structure; and performing a cutting operation on the substrate structure, so as to form openings communicated with the light-transmitting hole on two opposite cutting surfaces of the packaging area, respectively, so that two opposite sides of the light-transmitting glass are inserted into the two openings, respectively, thus obtaining the chip packaging structure.

The packaging substrate provided in the present disclosure is embedded with the light-transmitting glass therein, and after the packaging and the cutting operation are completed, two sides of the light-transmitting glass are exposed from the two opposite cutting surfaces, thus detachment of the light-transmitting glass may be realized, facilitating the replacement of the light-transmitting glass.

Optionally, the method further includes:

taking a first substrate, and grooving a middle area of the first substrate to form a first light-transmitting hole penetrating through upper and lower surfaces thereof, thus obtaining a first light-transmitting substrate;

grooving the upper surface of the first light-transmitting substrate to form a placement groove communicated with the first light-transmitting hole and having a height difference therebetween;

fixing the light-transmitting glass in the placement groove using sealing glue, wherein the surface of the light-transmitting glass is flush with the upper surface of the first light-transmitting substrate, and the sealing glue is of a thermoplastic material; and laminating a second light-transmitting substrate on the upper surface of the first light-transmitting substrate, wherein a second light-transmitting hole penetrates through upper and lower surfaces of the second light-transmitting substrate, thus obtaining the packaging substrate.

Optionally, after laminating the second light-transmitting substrate on the upper surface of the first light-transmitting substrate, the method further includes:

laminating a substrate fence on one side of the second light-transmitting substrate away from the light-transmitting glass, and arranging the substrate fence around the second light-transmitting hole, for blocking the filling glue between the bumps of the chip and the packaging substrate from entering the photosensitive area of the chip.

Optionally, packaging the chip on the upper surface of the packaging area includes:

mounting the chip on the upper surface of the packaging area;

filling gaps between the bumps of the chip and the packaging substrate with the filling glue, and curing the filling glue;

performing plastic packaging treatment on the chip to obtain a packaging layer for wrapping the chip; and performing a ball mounting process on the upper surface of the packaging area, so as to form metal balls on the packaging area, wherein the metal balls are electrically connected to the circuit structure on the packaging area.

In order to make the above objectives, features and advantages to be realized in the embodiments of the present disclosure more apparent and understandable, detailed description is made below specifically with reference to preferred embodiments in conjunction with the accompanying drawings.

Embodiments of the present disclosure provide a chip packaging structure and a chip packaging method, which can realize detachment of light-transmitting glass, then when the light-transmitting glass is damaged, only the damaged light-transmitting glass needs to be detached from the substrate, and replaced with new light-transmitting glass, so that the maintenance operation is quite simple, and the maintenance costs can also be effectively reduced. FIG. 1 shows a side view of a chip packaging structure in the present embodiment, and as shown in FIG. 1, the chip packaging structure includes:

a substrate 100, wherein a light-transmitting hole 110 penetrating through upper and lower surfaces thereof is provided on the substrate, and openings communicated with the light-transmitting hole 110 are formed on two opposite sidewall surfaces of the substrate 100, respectively;

light-transmitting glass 120, wherein two opposite sides of the light-transmitting glass are inserted into the two openings, respectively, and shield the light-transmitting hole 110;

a chip 130, provided on the upper surface of the substrate 100, wherein a photosensitive area 131 of the chip 130 faces the light-transmitting glass 120; and a packaging layer 140, provided on the chip 130 and the upper surface of the substrate 100 so as to package the chip 130 on the substrate 100.

It may be understood that the light-transmitting glass 120 includes four sides, wherein a first side and a third side are opposite to each other, a second side and a fourth side are opposite to each other, and the first side and the third side of the light-transmitting glass 120 are inserted into the two openings, so that edges of the first side and the third side of the light-transmitting glass 120 are exposed from two opposite side walls of the substrate 100.

Figure 2:
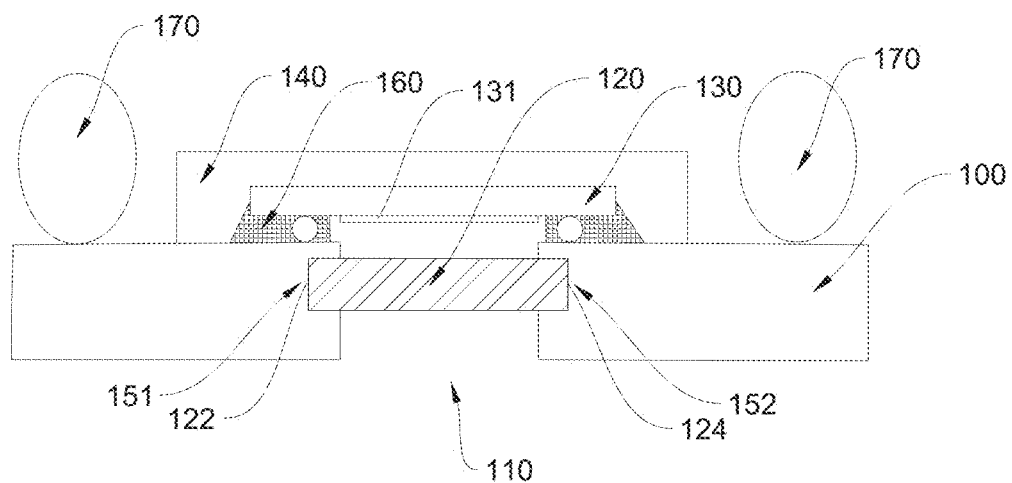
FIG. 2 is another side view of the chip packaging structure provided in an embodiment of the present disclosure.

Optionally, as shown in FIG. 2, a first clamping groove 151 is formed on a first sidewall surface of the light-transmitting hole 110, the first clamping groove 151 is in communication with the opening, the first clamping groove 151 extends along a connecting line direction of the two openings, and one side of the light-transmitting glass 120 is inserted into the first clamping groove 151. In addition, the packaging structure may further include a second clamping groove 152, the second clamping groove 152 parallel to and directly facing the first clamping groove 151 is provided on the second sidewall surface of the light-transmitting hole 110, the second clamping groove 152 is communicated with the opening, the second clamping groove 152 extends along the connecting line direction of the two openings, and the other side of the light-transmitting glass 120 is inserted into the second clamping groove 152. For ease of understanding, FIG. 2 simultaneously shows the first clamping groove 151 and the second clamping groove 152.

Through the first clamping groove 151 and the second clamping groove 152, a glass placement groove recessed into an inner sidewall is formed on an inner sidewall surface of the light-transmitting hole 110, a second side 122 of the light-transmitting glass 120 is fixed in the first clamping groove 151, and a fourth side 124 of the light-transmitting glass 120 is fixed in the second clamping groove 152, so that the light-transmitting glass 120 is fixed in the glass placement groove.

Optionally, the first clamping groove 151 and the second clamping groove 152 are filled with sealing glue, so as to fix the light-transmitting glass 120. During the packaging process, the sealing glue is filled in the glass placement groove formed by the two clamping grooves, and the light-transmitting glass 120 is fixed in the placement groove by the glue. It should be noted that the sealing glue used in the present embodiment is of a thermoplastic material, and after being heated, the sealing glue can flow and deform, so that the light-transmitting glass 120 is displaced with respect to the two openings, the light-transmitting glass 120 may be pushed out from the sidewall surface along the extending direction of the opening, realizing detachment of the light-transmitting glass 120, therefore, when the light-transmitting glass 120 needs to be replaced, only the sealing glue needs to be heated, and then the light-transmitting glass 120 is pushed out from the sidewall of the substrate 100, thus the detachment may be completed. After being cooled, the sealing glue may maintain a certain shape, and play a fixing effect. After the detachment of the light-transmitting glass 120 is completed, it only needs to fill new sealing glue in the glass placement groove, and push new light-transmitting glass from the sidewall. The mounting of the light-transmitting glass 120 can be completed just after the sealing glue is cooled. It can be seen that the chip packaging structure in the present embodiment may conveniently realize the detachment and mounting of the light-transmitting glass 120, and better achieve the maintenance effect on the chip packaging structure.

Optionally, bumps of the chip 130 are electrically connected to a circuit structure on the substrate 100, and filling glue 160 is provided between the bumps and the substrate 100; and a substrate fence is provided on the upper surface of the substrate 100, wherein the substrate fence is provided around the light-transmitting hole 110, so as to block the filling glue from entering the photosensitive area 131 of the chip 130.

Optionally, the chip packaging structure further includes: metal balls 170 provided outside the packaging layer 140, the metal balls 170 are electrically connected to the circuit structure on the substrate 100, and the metal balls 170 and the chip 130 are provided on the same side of the substrate 100.

Figure 3:
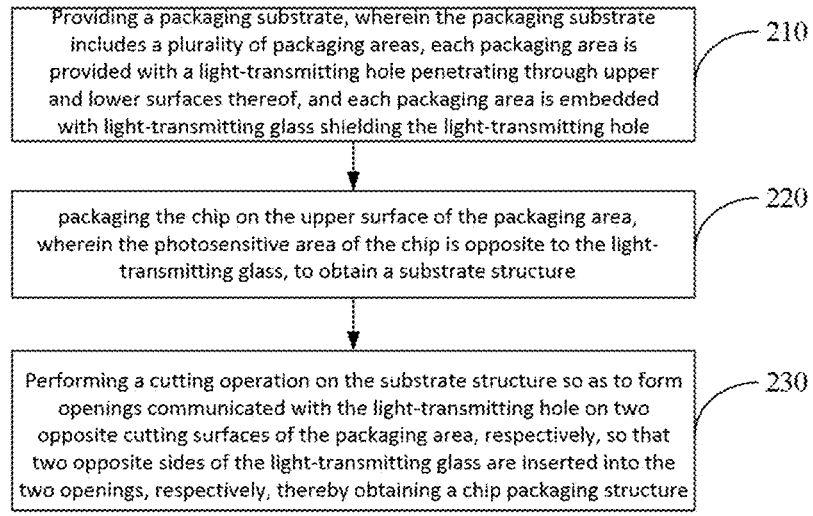
FIG. 3 is a process flow diagram of a chip packaging method provided in an embodiment of the present disclosure.

An embodiment of the present disclosure provides a chip packaging method below. The packaging method may be used in the packaging process of the above chip packaging structure so as to make the above chip packaging structure. FIG. 3 shows a process flow chart of the chip packaging method, and as shown in FIG. 3, the packaging method includes:

Step 210: providing a packaging substrate, wherein the packaging substrate includes a plurality of packaging areas, each packaging area is provided with a light-transmitting hole penetrating through upper and lower surfaces thereof, and each packaging area is embedded with light-transmitting glass shielding the light-transmitting hole.

Figure 4:
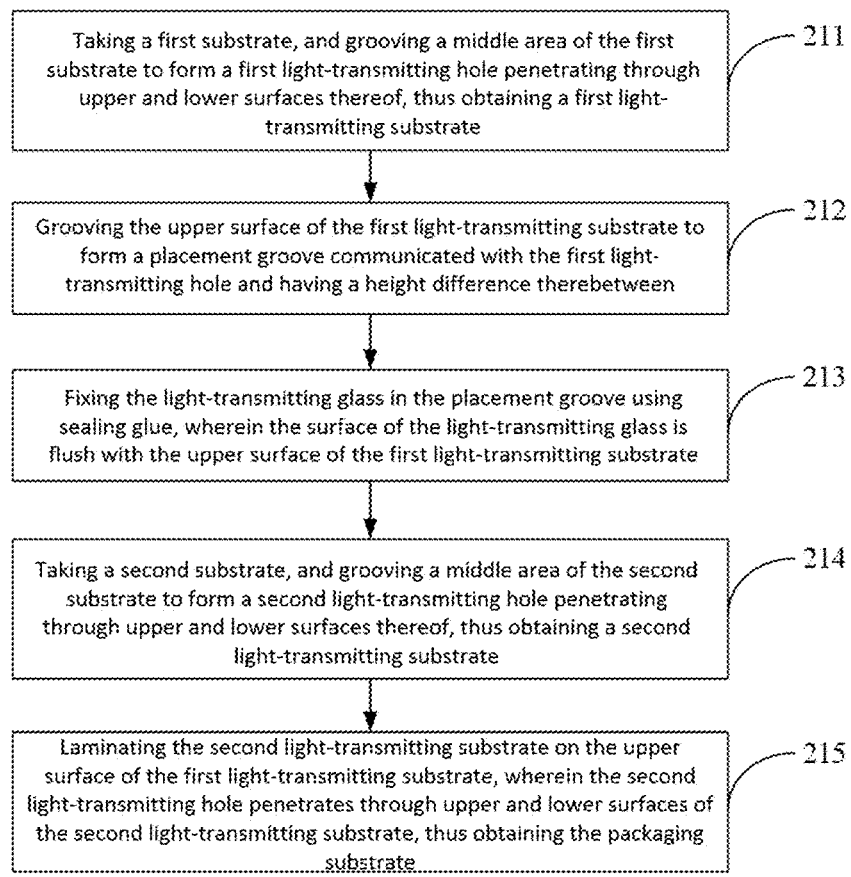
FIG. 4 is a flow chart of a substrate manufacturing process in the chip packaging method provided in an embodiment of the present disclosure.

The packaging substrate includes a plurality of packaging areas, and each packaging area is provided with a corresponding circuit structure therein. Meanwhile, each packaging area is provided with the light-transmitting hole penetrating through the upper and lower surfaces thereof, and the light-transmitting glass is mounted in each packaging area. The packaging substrate may be directly provided by a substrate plant. As shown in FIG. 4, a substrate manufacturing process of the above packaging substrate is as follows:

Step 211: taking a first substrate, and grooving a middle area of the first substrate to form a first light-transmitting hole penetrating through upper and lower surfaces thereof, thus obtaining a first light-transmitting substrate.

Step 212: grooving the upper surface of the first light-transmitting substrate to form a placement groove communicated with the first light-transmitting hole and having a height difference therebetween.

Step 213: fixing the light-transmitting glass in the placement groove using sealing glue, wherein the surface of the light-transmitting glass is flush with the upper surface of the first light-transmitting substrate.

Step 214: taking a second substrate, and grooving a middle area of the second substrate to form a second light-transmitting hole penetrating through upper and lower surfaces thereof, thus obtaining a second light-transmitting substrate.

The execution sequence of step 214 is not limited, and it may be executed concurrently with any one of steps 211~214, or may be fabricated in advance.

Step 215: laminating the second light-transmitting substrate on the upper surface of the first light-transmitting substrate, wherein the second light-transmitting hole penetrates through upper and lower surfaces of the second light-transmitting substrate, thus obtaining the packaging substrate.

In the above manufacturing processing, first, the substrate (this substrate may be made of a polypropylene sheet material) is placed at the bottom, and the substrate is grooved in the middle by laser grooving to obtain the light-transmitting hole at the bottom of the substrate, and light enters the substrate through the light-transmitting hole. Next, the surface of the substrate is grooved again by laser grooving, and the grooved area is removed, to form a glass placement groove, and the size of the grooving area may be determined according to the requirements of the size of the light-transmitting glass. Next, the light-transmitting glass is placed on the glass placement groove, and the bottom of the light-transmitting glass is fixed in the substrate placement groove using sealing glue, thus completing the placement of the light-transmitting glass. The sealing glue may be made of light absorbing, thermoplastic material, so as to prevent light from being scattered, refracted or reflected at the place of the sealing glue thanks to the light absorbing property of the material, and the light-transmitting glass can be detached from the side after being heated due to the thermoplastic property of the material. In an optional design, two opposite edges of the light-transmitting glass are designed on a cutting path of the substrate. In the subsequent cutting process, after cutting along the cutting path of the substrate, the light-transmitting glass side is exposed from two sides of the substrate, so as to realize detachment after heating. It may be understood that the edge of the light-transmitting glass also may be beyond the range of the cutting path of the substrate. After the cutting, the light-transmitting glass exceeding the range is removed. Alternatively, the two opposite sides of the light-transmitting glass may be exposed from the two sides of the substrate. Next, a glass protective film is used to protect the surface of the light-transmitting glass, and then the substrate with the same size and also provided with the light-transmitting hole is laminated again (this substrate may also be made of the polypropylene sheet material). After the above operations are completed, the light-transmitting glass is embedded in the packaging substrate.

Figure 5:
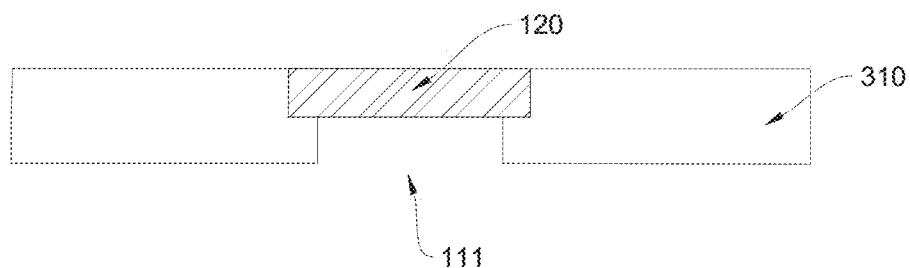
FIG. 5 is a schematic view of a first structure of the substrate manufacturing process provided in an embodiment of the present disclosure.
Figure 6:
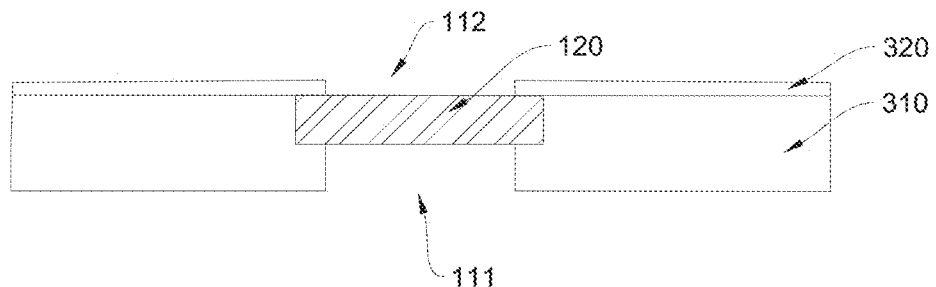
FIG. 6 is another schematic view of the first structure of the substrate manufacturing process provided in an embodiment of the present disclosure.
Figure 7:
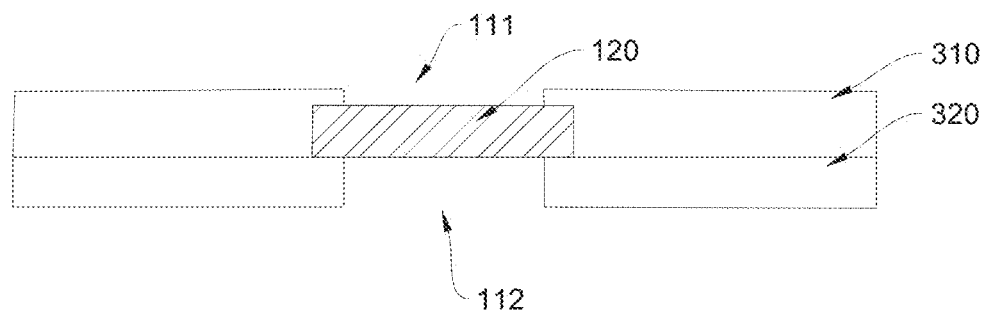
FIG. 7 is a schematic view of a second structure of the substrate manufacturing process provided in an embodiment of the present disclosure.

The packaging substrate provided in the present embodiment is made by laminating two layers of substrates, and FIG. 5~FIG. 7 show two structures of the substrate manufacturing process. For the first one, as shown in FIG. 5, the first substrate is grooved to form the first light-transmitting hole 111 and the glass placement groove to obtain the first light-transmitting substrate 310, and the light-transmitting glass 120 is placed in the glass placement groove of the first light-transmitting substrate 310; as shown in FIG. 6, the second light-transmitting substrate 320 is laminated again above the light-transmitting glass 120, and the second light-transmitting substrate 320 is provided with a second light-transmitting hole 112 penetrating through the upper and lower surfaces thereof. The size of the second light-transmitting hole may be the same as the size of the first light-transmitting hole, so that the two light-transmitting holes are matched with each other. For the second one, as shown in FIG. 7, the structure thereof is similar to the previous structure, the embedding of the light-transmitting glass may also be realized, and it may be manufactured with reference to the previous manner, without difference in the manufacturing process.

In the present embodiment, by placing the light-transmitting glass inside the substrate, problems that the light-transmitting glass is extruded and damaged (glass is brittle and fragile in property) and the surface of the glass is scratched and the like in the post-manufacturing process or the using process can be avoided.

After Step 210, step 220 is continued: packaging the chip on the upper surface of the packaging area, wherein the photosensitive area of the chip is opposite to the light-transmitting glass, to obtain a substrate structure.

Figure 8:
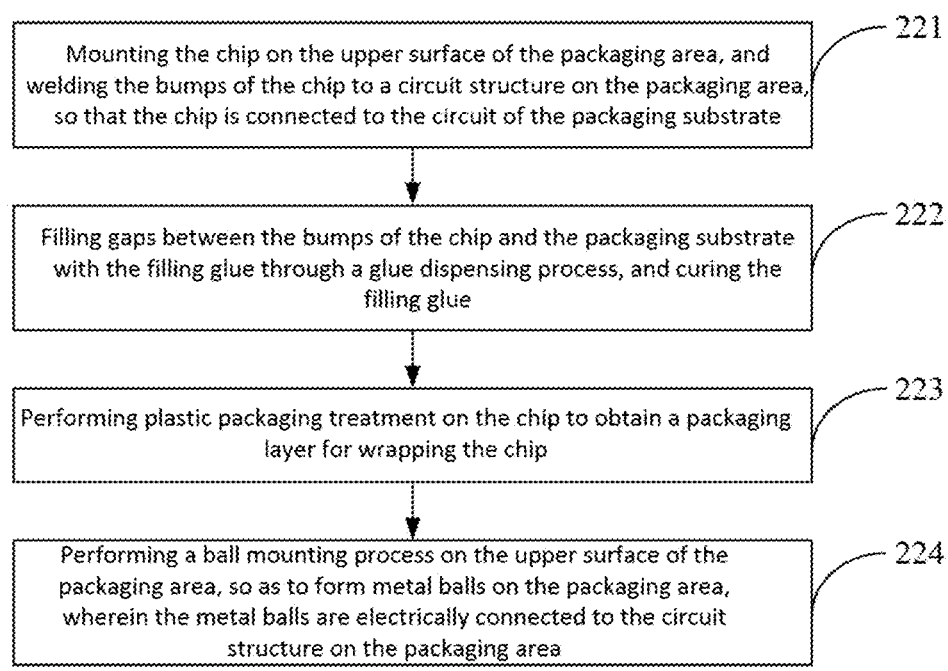
FIG. 8 is a specific flow chart of step 220 in the chip packaging method provided in an embodiment of the present disclosure.

As shown in FIG. 8, the above packaging step includes:

Step 221: mounting the chip on the upper surface of the packaging area, and welding the bumps of the chip to a circuit structure on the packaging area, so that the chip is connected to the circuit of the packaging substrate.

Specifically, the bumps of the chip may be welded to the packaging substrate by reflow soldering. An integrated functional circuit is fabricated on the chip, and the integrated functional circuit is used for converting an optical signal sensed by the photosensitive area into an electrical signal. The photosensitive area is opposite to the light-transmitting glass disposed in the packaging area, and light is incident from the light-transmitting hole on the packaging substrate, then enters the light-transmitting glass, and reaches the photosensitive area of the chip through the light-transmitting glass. The light-transmitting glass has relatively good light transmittance, for example, the light transmittance of the selected light-transmitting glass is higher than 90%.

Step 222: filling gaps between the bumps of the chip and the packaging substrate with the filling glue through a glue dispensing process, and curing the filling glue.

Optionally, in the substrate manufacturing process, the method further includes: laminating a substrate fence on one side of the second light-transmitting substrate away from the light-transmitting glass, and arranging the substrate fence around the second light-transmitting hole. After the substrate fence is laminated, areas that do not require the fence are etched away and the glass protective film is removed, thereby obtaining the packaging substrate provided with the substrate fence, and completing the substrate manufacturing process. The substrate fence on the surface of the packaging area may block the filling glue from entering the photosensitive area of the chip, in this way, the problem of light scattering and refracting from the area of the bumps of the chip may be solved, and meanwhile, the chip photosensitive area is prevented from being polluted by the glue.

Step 223: performing plastic packaging treatment on the chip to obtain a packaging layer for wrapping the chip.

The chip on the upper surface of the packaging substrate is subjected to plastic packaging, the chip is protected by a plastic packaging material, the chip is packaged on the packaging substrate, and finally a packaging layer is formed on the upper surface of the packaging substrate and the chip.

Step 234: performing a ball mounting process on the upper surface of the packaging area, so as to form metal balls on the packaging area, wherein the metal balls are electrically connected to the circuit structure on the packaging area.

Ball mounting is performed on the upper surface of the packaging area, for example, tin ball mounting, and the tin balls are electrically connected to the circuit structure on the packaging area, so that a required circuit is formed with an integrated functional circuit on the chip through the connected circuit structure. The tin balls are disposed at the periphery of the packaging layer, and are disposed on the same side of the packaging substrate as the chip. After the ball mounting process is completed, a substrate structure is obtained.

After step 220, step 230 is continued: perform a cutting operation on the substrate structure so as to form openings communicated with the light-transmitting hole on two opposite cutting surfaces of the packaging area, respectively, so that two opposite sides of the light-transmitting glass are inserted into the two openings, respectively, thereby obtaining a chip packaging structure.

After the ball mounting is performed on the surface of the packaging substrate, the substrate structure from the previous process is cut using a cutting machine. After the cutting process, a plurality of small chip packaging structures are cut from the substrate structure according to the cutting path of the substrate provided on the substrate, and each chip packaging structure is corresponding to one packaging area on the packaging substrate. After cutting, two opposite cutting surfaces on the same packaging area expose sides of the light-transmitting glass. Then, the light-transmitting glass may be detached from the side of the chip packaging structure by melting the sealing glue at the bottom of the light-transmitting glass by heating. After the substrate structure is cut into a single product, the packaging of the image sensing chip is completed.

Processes involved in the chip packaging method in the present embodiment include:

1. Substrate: completing the manufacture of the first layer of substrate in a substrate plant, and forming the light-transmitting hole and the glass placement groove on the first layer of substrate.

2. Dispensing glue: dispensing the sealing glue in the glass placement groove of the first layer of substrate using a glue dispensing machine.

3. Pasting the light-transmitting glass: mounting the light-transmitting glass on the sealing glue using a machine.

5. Substrate: laminating a second layer of substrate on the light-transmitting glass in the substrate plant, and completing the manufacture of the substrate fence to obtain a packaging substrate.

6. Pasting the flip chip: mounting the flip chip on the packaging substrate using a machine, and completing chip welding after reflowing.

7. Dispensing glue: filling the bottom of the chip with a glue dispensing machine, and then curing the glue.

8. Plastic packaging: protecting the laminated chip with plastic packaging using a plastic packaging machine.

9. Mounting balls: mounting tin balls on the packaging substrate.

10. Cutting: cutting the packaging substrate using a cutting machine to form a single product.

The above processes 1-5 may be completed in, but not limited to, a substrate plant. Then, the substrate plant provides the packaging substrate satisfying the requirements, and during specific packaging, the packaging is completed just through the processes 6~10.

Beneficial effects of the embodiments of the present disclosure include:

(1) by embedding the light-transmitting glass in the substrate, and exposing two sides of the light-transmitting glass through corresponding openings on two sidewall surfaces of the substrate, the light-transmitting glass may be pushed out from the sides of the substrate, and detachment of the light-transmitting glass from the sides is realized, so that the light-transmitting glass can be changed quite conveniently, and the maintenance costs of the chip are reduced; moreover, the light-transmitting glass is disposed inside the substrate, then the light-transmitting glass may be protected, the service time thereof is prolonged, and damage/scratching caused by placement of the light-transmitting glass on the surface of the substrate is avoided;

(2) by providing the glass placement groove inside the substrate, fixing the light-transmitting glass with the sealing glue, designing the edge of the light-transmitting glass on the cutting path of the substrate, and exposing the side of the light-transmitting glass after cutting the substrate, detachment of the light-transmitting glass from the side is realized after the sealing glue at the bottom of the glass is heated, then on the one hand, the mounting of the light-transmitting glass is more solid, and on the other hand, the detachment and installation thereof are also more convenient;

(3) by providing the substrate fence on the substrate, when glue is filled at the bottom of the chip, the filling glue is prevented from entering the photosensitive area of the chip by the height of the fence, so that light may be avoided from scattering and refracting from the bump area of the chip to cause the problem of blurring of product image, and the product yield is improved;

(4) by providing the welding points of the tin balls outside the packaging layer, damage or contamination of the chip during welding for mounting balls is avoided; and (5) by protecting the chip with the packaging layer, damage of the chip caused by moisture and stress is avoided.

The above-mentioned are merely for embodiments of the present disclosure and not intended to limit the scope of protection of the present disclosure. For one skilled in the art, various modifications and variations may be made to the present disclosure. Any modifications, equivalent substitutions, improvements and the like made within the spirit and principle of the present disclosure are intended to be included within the protection scope of the present disclosure.

INDUSTRIAL APPLICABILITY

For the chip packaging structure and the chip packaging method provided in the present disclosure:

(1) by embedding the light-transmitting glass in the substrate, and exposing two sides of the light-transmitting glass through corresponding openings on two sidewall surfaces of the substrate, the light-transmitting glass may be pushed out from the sides of the substrate, and detachment of the light-transmitting glass from the sides is realized, so that the light-transmitting glass can be changed quite conveniently, and the maintenance costs of the chip are reduced; moreover, the light-transmitting glass is disposed inside the substrate, then the light-transmitting glass may be protected, the service time thereof is prolonged, and damage/scratching caused by placement of the light-transmitting glass on the surface of the substrate is avoided;

(2) by providing the glass placement groove inside the substrate, fixing the light-transmitting glass with the sealing glue, designing the edge of the light-transmitting glass on the cutting path of the substrate, and exposing the side of the light-transmitting glass after cutting the substrate, it is realized that the light-transmitting glass is detached from the side after the sealing glue at the bottom of the glass is heated, then on the one hand, the mounting of the light-transmitting glass is more solid, and on the other hand, the detachment and installation thereof are also more convenient;

(3) by providing the substrate fence on the substrate, when glue is filled at the bottom of the chip, the filling glue is prevented from entering the photosensitive area of the chip by the height of the fence, so that light may be avoided from scattering and refracting from the bump area of the chip to cause the problem of blurring of product image, and the product yield is improved;

(4) by providing the welding points of the tin balls outside the packaging layer, damage or contamination of the chip during welding for mounting balls is avoided; and (5) by protecting the chip with the packaging layer, damage of the chip caused by moisture and stress is avoided.

What is claimed is:

1. A chip packaging method, comprising:
providing a packaging substrate, wherein the packaging substrate comprises a plurality of packaging areas, each of the packaging areas is provided with a light-transmitting hole penetrating through upper and lower surfaces thereof, and a light-transmitting glass shielding the light-transmitting hole is embedded in each of the packaging areas;
packaging a chip on an upper surface of each of the packaging areas, wherein a photosensitive area of the chip faces the light-transmitting glass, so as to obtain a substrate structure; and
performing a cutting operation on the substrate structure, so as to form openings communicated with the light-transmitting hole on two opposite cutting surfaces of each of the packaging areas, respectively, so that two opposite sides of the light-transmitting glass are inserted into two openings, respectively, so as to obtain the chip packaging structure,
wherein the method further comprises:
making a first substrate grooved with a first light-transmitting hole formed in a middle area of the first substrate so as to obtain a first light-transmitting substrate, wherein the first light-transmitting hole penetrates through upper and lower surfaces of the first substrate;
grooving an upper surface of the first light-transmitting substrate to form a placement groove with a height difference therebetween, which is communicated with the first light-transmitting hole;
fixing the light-transmitting glass in the placement groove using sealing glue, wherein a surface of the light-transmitting glass is flush with the upper surface of the first light-transmitting substrate, and the sealing glue is of a thermoplastic material; and
laminating a second light-transmitting substrate on the upper surface of the first light-transmitting substrate, wherein a second light-transmitting hole penetrates through upper and lower surfaces of the second light-transmitting substrate, so as to obtain the packaging substrate.

2. The packaging method according to claim 1, wherein after the laminating a second light-transmitting substrate on the upper surface of the first light-transmitting substrate, the method further comprises:
laminating a substrate fence on one side of the second light-transmitting substrate away from the light-transmitting glass, wherein the substrate fence is arranged around the second light-transmitting hole, which is configured to block filling glue between the bumps of the chip and the packaging substrate from entering the photosensitive area of the chip.

3. The packaging method according to claim 1, wherein the packaging a chip on an upper surface of each of the packaging areas comprises:
mounting the chip on the upper surface of each of the packaging areas;
filling gaps between the bumps of the chip and the packaging substrate by using the filling glue, and curing the filling glue;
performing plastic packaging treatment on the chip, so as to obtain a packaging layer wrapping the chip; and
performing a ball mounting process on the upper surface of each of the packaging areas, so as to form metal balls on each of the packaging areas, wherein the metal balls are electrically connected to a circuit structure on a corresponding packaging area.

4. The packaging method according to claim 1, wherein the packaging a chip on an upper surface of each of the packaging areas comprises:
mounting the chip on the upper surface of each of the packaging areas;
filling gaps between the bumps of the chip and the packaging substrate by using the filling glue, and curing the filling glue;
performing plastic packaging treatment on the chip, so as to obtain a packaging layer wrapping the chip; and
performing a ball mounting process on the upper surface of each of the packaging areas, so as to form metal balls on each of the packaging areas, wherein the metal balls are electrically connected to a circuit structure on a corresponding packaging area.

5. The packaging method according to claim 2, wherein the packaging a chip on an upper surface of each of the packaging areas comprises:
mounting the chip on the upper surface of each of the packaging areas;
filling gaps between the bumps of the chip and the packaging substrate by using the filling glue, and curing the filling glue;
performing plastic packaging treatment on the chip, so as to obtain a packaging layer wrapping the chip; and
performing a ball mounting process on the upper surface of each of the packaging areas, so as to form metal balls on each of the packaging areas, wherein the metal balls are electrically connected to a circuit structure on a corresponding packaging area.

* * * * *